United States Patent [19]

Abe et al.

[11] Patent Number: 4,926,330

[45] Date of Patent: May 15, 1990

[54] DIAGNOSIS SYSTEM FOR A MOTOR VEHICLE

[75] Inventors: Kunihiro Abe; Tomoya Kobayashi, both of Tokyo, Japan

[73] Assignee: Fuji Jukogyo Kabushiki Kaisha, Tokyo, Japan

[21] Appl. No.: 278,796

[22] Filed: Nov. 30, 1988

[30] Foreign Application Priority Data

Dec. 21, 1987 [JP] Japan ................................ 62-324446

[51] Int. Cl.[5] ...................... G01M 15/00; F02D 41/26; F02P 17/00

[52] U.S. Cl. .............................. 364/424.03; 73/117.2; 364/431.01; 364/551.01

[58] Field of Search ........... 364/431.1, 551.01, 431.11, 364/424.03, 424.04; 73/116, 117.3, 119 R, 117.2; 371/20

[56] References Cited

U.S. PATENT DOCUMENTS 4,108,362 8/1978 Trussel et al. ........................ 73/116
4,125,854 11/1978 Cashel et al. ....................... 73/117.2
4,337,515 6/1982 Kreft ................................. 73/117.2
4,567,756 2/1986 Colborn ............................. 73/118.1
4,694,408 9/1987 Zaleski ................................. 73/116
4,748,843 6/1988 Schäfer et al. .

FOREIGN PATENT DOCUMENTS 58-12848 1/1983 Japan .

*Primary Examiner*—Felix D. Gruber
*Attorney, Agent, or Firm*—Martin A. Farber

[57] ABSTRACT

A system for diagnosing a motor vehicle has a diagnosis device including a computer having a central processing unit and a memory, the memory having a plurality of programs for diagnosing an electronic control system for controlling an engine. Terminals are provided on a case of the diagnosis device for receiving analog signals from elements of the vehicle. An analog of digital converter is provided in the diagnosis device connected with the terminals for converting an analog signal to a digital signal, thereby monitoring the elements of the vehicle.

2 Claims, 4 Drawing Sheets

DIAGNOSIS SYSTEM FOR A MOTOR VEHICLE

BACKGROUND OF THE INVENTION

The present invention relates to a diagnosis system for a motor vehicle, and more particularly to a system provided with a device for checking automotive electric systems.

Recently, a motor vehicle has been equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out trouble. Accordingly, a trouble diagnosis device for easily checking the electronic control system should be provided as equipment in an auto shop.

Japanese Patent Application Laid-Open No. 58-12848 discloses a diagnosis system in which an exclusive checking device is provided for measuring a pulse duration of fuel injection and an engine speed, and for checking whether idling speed is normal. The checking device is provided for diagnosing only designated specific types of motor vehicles.

However, the main aim of the conventional diagnosis system is to monitor input and output signals of the electronic control system. Accordingly, at trouble shooting, in order to check voltage of elements such as various switches and electronic meters in an automotive electric system, or to check the grounding or connection of harness thereto in an electric circuit, a tester must be additionally used. Thus, the operation becomes troublesome.

SUMMARY OF THE INVENTION

The object of the present invention is to provide a diagnosis system for a motor vehicle where automotive electric systems can be easily checked as well as the electronic control system.

The other objects and features of this invention will become understood from the following description with reference to the accompanying drawings.

DETAILED DESCRIPTION OF THE PREFERRED EMBODIMENT

Figure 1A:
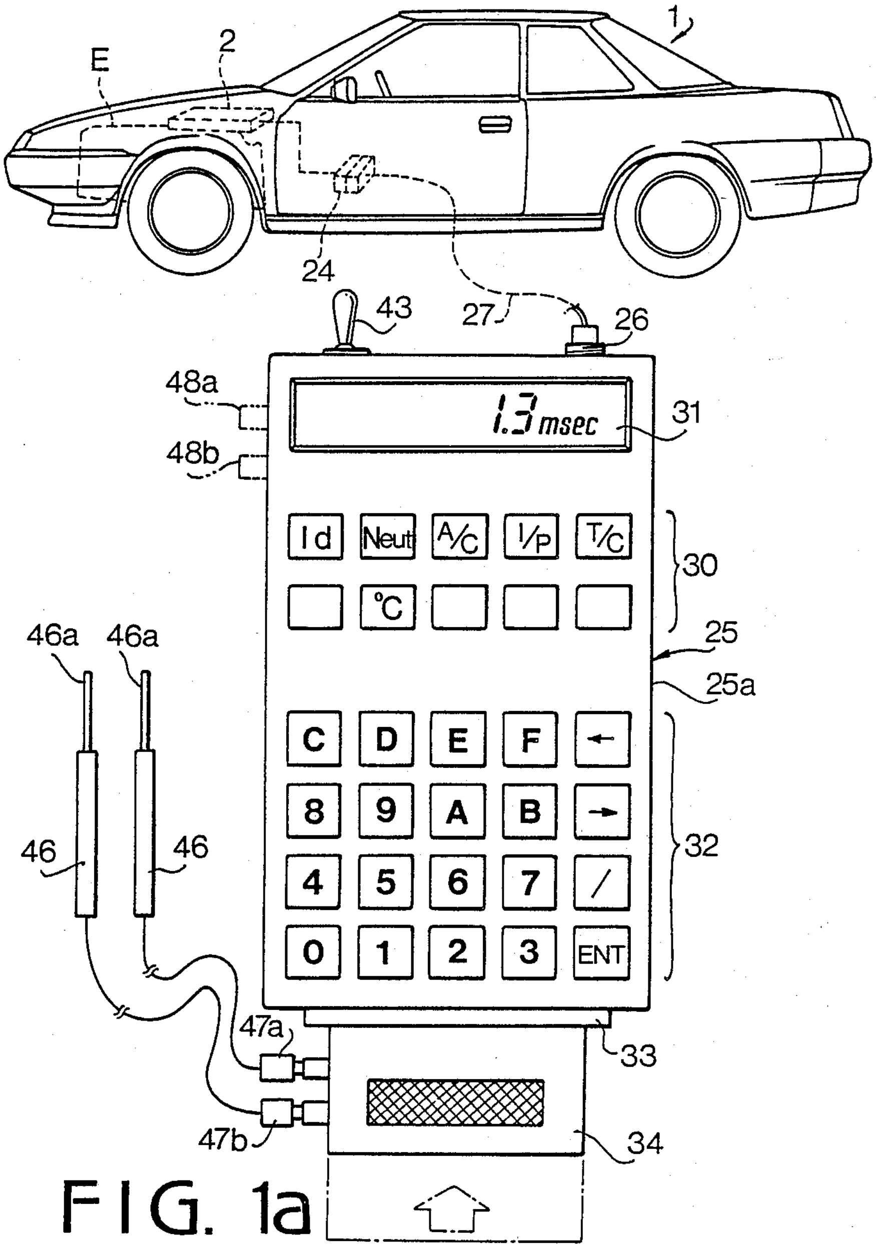
FIG. 1*a* is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer is housed in a case **25*a* and has a connector 26, to which the connector 24 of the system 2 is connected through an adapter harness 27**.

The diagnosis device 25 has a power switch 43, a liquid crystal display 31, an indicator section 30 consisting of a plurality of indicators of LED, and a keyboard 32. A connector 33 is provided for connecting a detachable memory cartridge 34.

Figure 2A:
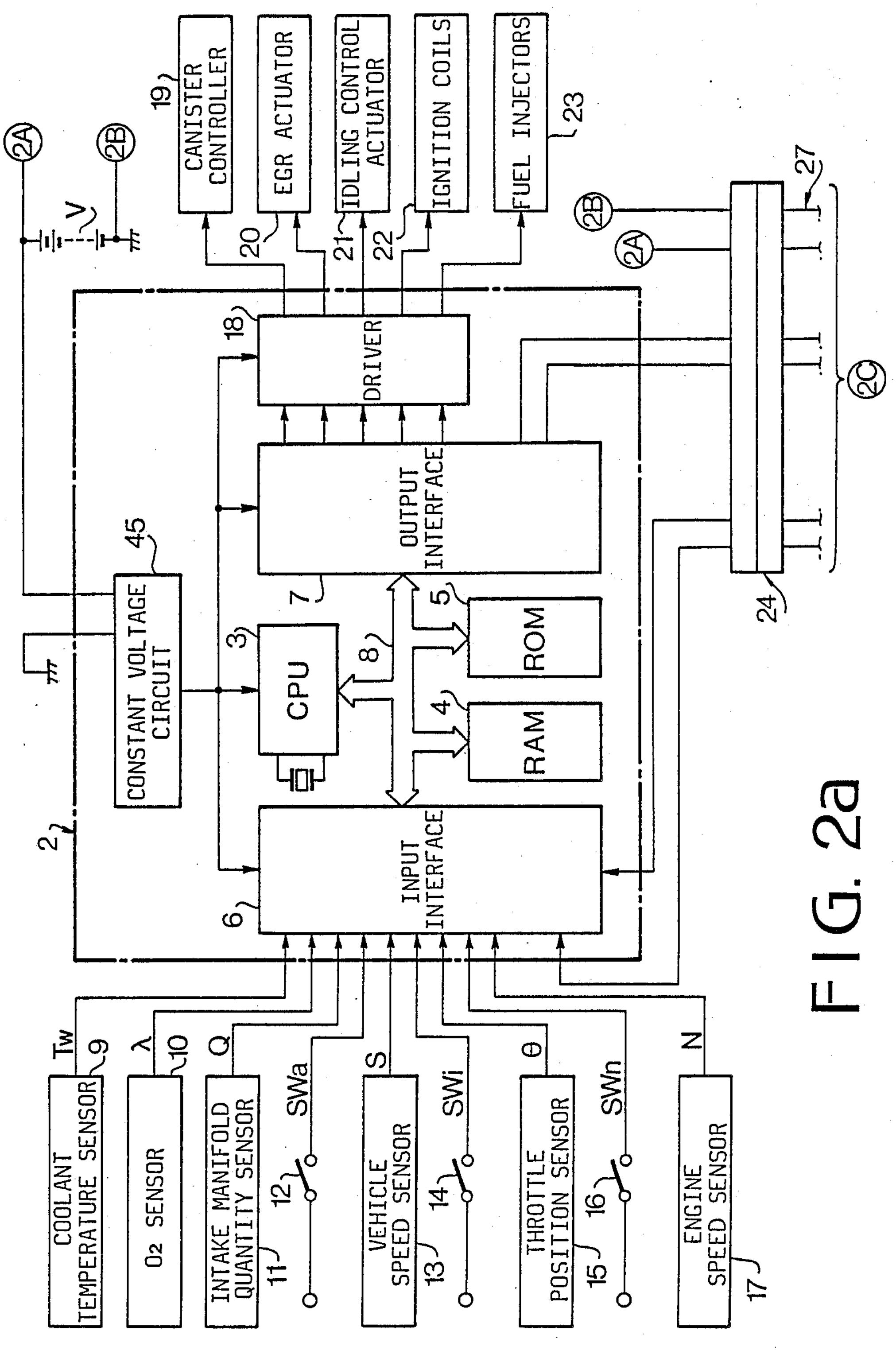
FIG. 2*a* shows a block diagnosis device at tester of the electronic control system.
Figure 2B:
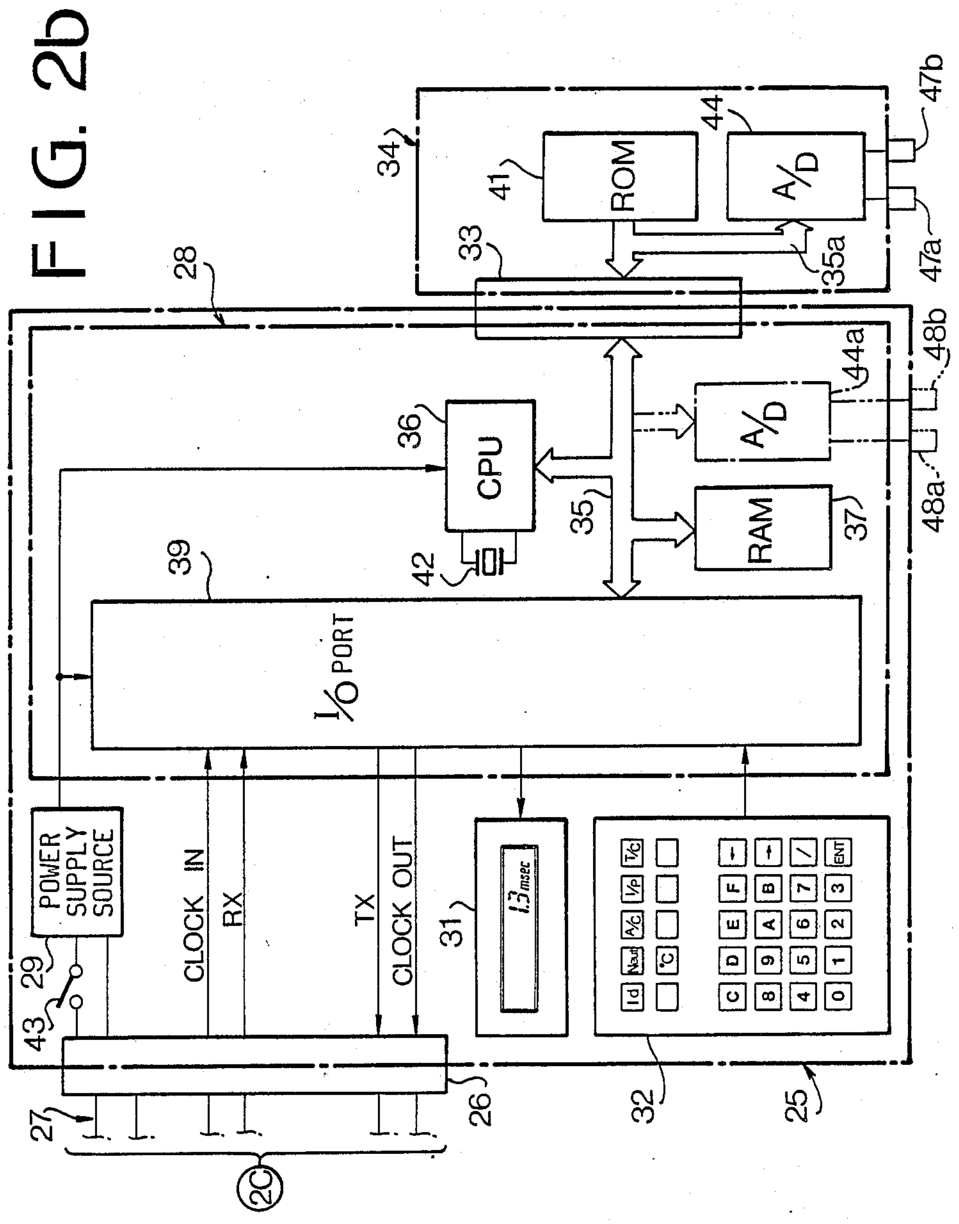
FIG. 2*b* shows a block diagram of a diagnostic system.

Referring to FIGS. 2*a* and 2*b*, the electronic control system 2 comprises a central processor unit (CPU) 3, a random access memory (RAM) 4, a read only memory (ROM) 5, an input interface 6 and an output interface 7. These CPU 3, RAM 4, ROM 5, input and output interfaces 6 and 7 are connected to each other through a bus line 8. Programs and data for controlling the engine are stored in the ROM 5. Power is supplied to the CPU 3, input and output interfaces 6 and 7, and driver 18 from a source V through a constant voltage circuit 45.

The input interface 6 is applied with a coolant temperature signal Tw from a coolant temperature sensor 9, an air-fuel ratio feedback signal $\lambda$ from an $O_2$ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal $\theta$ from a throttle position sensor 15, a neutral positioning signal SWn from a neutral switch 16 in a transmission, and an engine speed signal N from an engine speed sensor 17. These signals are stored in the RAM 4 after data processing in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22, and fuel injectors 23.

The diagnosis device 25 has a control unit 28 and a power supply source 29. The control unit 28 comprises a CPU 36, a RAM 37, and input/output (I/O) port 39. These elements are connected to each other through a bus line 35. A clock pulse generator 42 is provided for generating synchronizing pulses. A ROM 41 provided in the memory cartridge 34 is connected to the bus line 35 through the connector 33. The ROM 41 stores a plurality of programs for diagnosing various troubles of the control system 2. Inputs of the I/O port 39 are connected to the output interface 7 of the control system 2 through connectors 24 and 26 and harness 27 so as to receive output signals of sensors and switches 9 to 17. Inputs of the I/O port 39 are connected to the keyboard 32 for applying a mode select signal dependent on the operation of the keyboard, and to the output interface 7. Outputs of the port 39 are connected to the input interface 6 and the display 31. The power source 29 for supplying the power to the CPU 36 and I/O port 39 is connected to the source V through the power switch 43.

The memory cartridge 34 has an analog to digital (A/D) converter 44 which is connected with the control unit 28 of the diagnosis device 25 through a bus line **35*a*. Input terminals of the A/D converter 44 are connected to terminals 47*a* and 47*b* on the cartridge 34. In order to check automotive electric systems, probes 46, each having a probe chip 46*a* at an end thereof, are detachably connected to the terminals 47***a* and 47*b*. When a tester mode for checking electric systems is selected by operating the keyboard 32 of the diagnosis device 25, signals from the A/D converter 44 are selectively applied to the control unit 28 so as to make calculation dependent on the signals.

Before performing the diagnosis program, the control system 2 is connected to the diagnosis device 25 through the harness 27 and cartridge 34 is attached to the diagnosis device 25. The probes 46 are attached to the terminals 47*a*, 47*b*.

Figure 3:
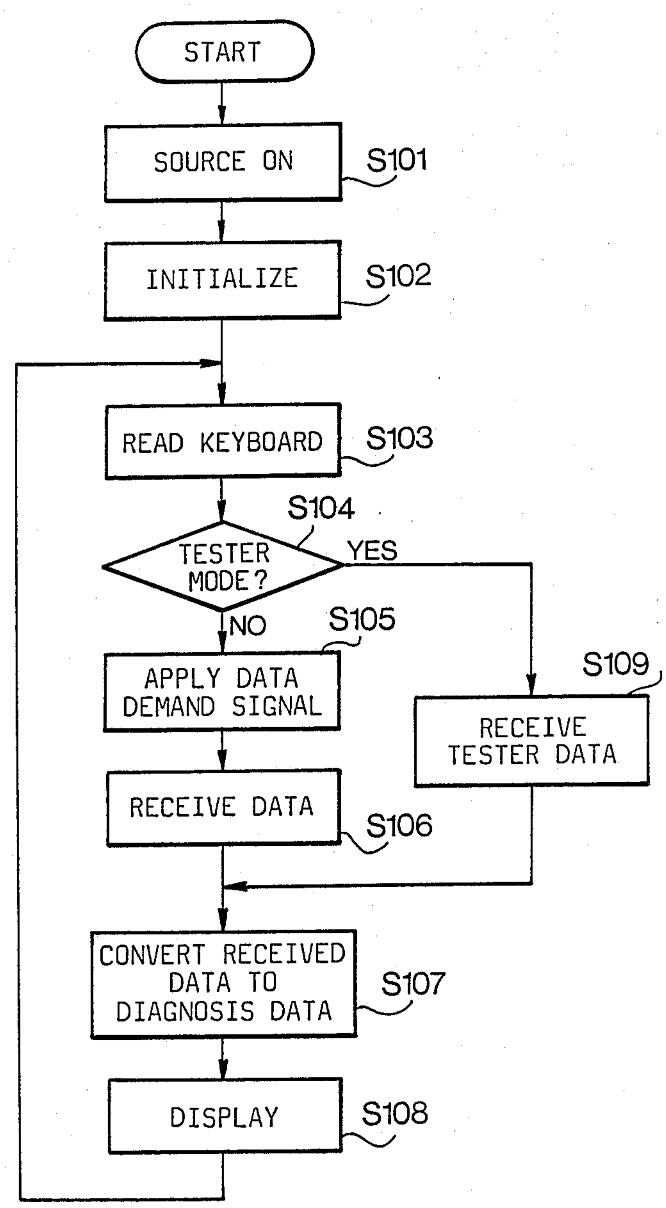
FIG. 3 is a flowchart showing an operation of the system.

The operation of the system is described hereinafter with reference to the flowchart of FIG. 3. The engine is started, and the following diagnosis program is performed under the running condition of the engine.

The power switch 43 is turned on at a step S101. At a step S102, initialization of the control unit 28 is performed. A diagnostician operates the keyboard 32 to perform the diagnosis of the engine or of the electric system. For example, when the injection pulse width is confirmed, a mode code or mark for the pulse width (for example F→1→2→ENT) is input by operating the keyboard 32. On the other hand, when the electric system is checked, another mode code (for example, F→A→2→ENT) is input. At a step S103, the mode code is stored in the RAM 37 and the stored mode is read by the CPU 36. At a step S104, it is determined whether the input mode is a diagnosis mode or a tester mode. At the diagnosis mode the program goes to a step S105.

(DIAGNOSIS MODE)

At the step S105, a corresponding data demand signal TX is applied to the system 2. At a step S106, a data signal RX representing a fuel injection pulse width is applied to the unit 28 from the control system 2. At a step S107, the received binary digit is converted into a decimal digit representing the pulse width. At a step S108, a pulse width, for example, 1.3 msec is displayed on the display 31 as shown in FIG. 1*a*. Thus, the diagnostician can diagnose the item about the fuel injection pulse width.

(TESTER MODE)

Figure 1B:
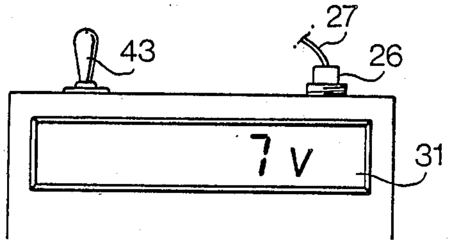
FIG. 1*b* shows a display of a diagnosis device at tester mode.

When the keyboard 32 is operated to input the tester mode code such as F→A→2→ENT at the step S103, the program proceeds to step S109 for checking the electric system at the tester mode. The diagnostician manipulates the probes 46 so as to bring the probe chips 46*a* in contact with specific terminals in the systems. Accordingly, an analog signal representing data such as voltage between the terminals is applied to the A/D converter 44 where the analog signal is converted into a digital signal. The digital signal is applied to the control unit 28. The program proceeds to the steps S107 and S108, thereby converting a binary digit to a decimal digit representing the voltage and displaying the voltage, for example 7v, on the display 31 as shown in FIG. 1*b*.

If the terminal voltage is not obtained, disconnection of the harness or defective grounding is inferred. Accordingly, checks on the related parts are further carried out.

As shown by chain lines 44*a* in FIG. 2*b*, the A/D converter 44 may be provided in the control unit 28 so as to be connected with the CPU 36 through the bus line 35. In such a case, the terminal 48*a* and 48*b* are formed in the diagnosis device 25 as shown in FIG. 1*a*.

From the foregoing it will be understood that the present invention provides a diagnosis system for a motor vehicle where both the electronic control system for controlling the engine and other electric systems of the vehicle can be checked with a single device so that operability and efficiency are improved.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A system for diagnosing a motor vehicle and an electronic control system for controlling an engine mounted on the vehicle, the control system having sensors for detecting operating conditions of the engine, comprising:

a diagnosis device including a case and a computer having a central processing unit and a memory storing a plurality of programs for diagnosing the electronic control system disposed in said case;

a connector connecting the computer to the electronic control system;

the diagnosis device including a keyboard for inputting a diagnosis mode and a tester mode;

means comprising terminals provided on the case of the diagnosis device for receiving an analog signal from a part of an electric system of the vehicle other than the electronic control system which controls the engine;

a converter disposed in said case for converting the analog signal received at the terminals to a digital signal and for applying the converted digital signal to the computer;

the computer including:

determining means for determining whether the diagnosis mode for diagnosing the electronic control system which controls the engine or the tester mode for testing the part of the electric system of the vehicle other than the electronic control system which controls the engine, which part produces the analog signal, is input through the keyboard and for producing a diagnosis mode signal or a tester mode signal in dependency on the determination;

data demand means responsive to the diagnosis mode signal for applying a data demand signal to the electronic control system;

data receiving means for receiving data from the electronic control system; and receiving means responsive to the tester mode signal for receiving said analog signal from the vehicle through the terminals and applying the analog signal to the converter for diagnosing the analog signal; and display means on the diagnosis device for displaying received data in a form of diagnosis data for both the tester mode and the diagnosis mode.

2. The system according to claim 1 further comprising probes connected to the terminals.

* * * * *